(12) United States Patent
Nalbant

(10) Patent No.: US 6,356,151 B1
(45) Date of Patent: Mar. 12, 2002

(54) MULTIPLE CHANNEL CLASS D AUDIO AMPLIFIER

(75) Inventor: Mehmet K. Nalbant, Irvine, CA (US)

(73) Assignee: Linfinity Microelectronics, Irvine, CA (US)

( * ) Notice: Subject to any disclaimer, the term of this patent is extended or adjusted under 35 U.S.C. 154(b) by 0 days.

(21) Appl. No.: 09/388,178

(22) Filed: Sep. 1, 1999

Related U.S. Application Data

(62) Division of application No. 08/899,445, filed on Jul. 23, 1997, now Pat. No. 5,982,231.

(51) Int. Cl.[7] ................................................. H03F 3/38
(52) U.S. Cl. ......................................... 330/251; 330/10
(58) Field of Search ............................... 330/10, 207 A, 330/251; 381/94.1, 94.5–94.8

(56) References Cited

U.S. PATENT DOCUMENTS

| | | | | |
|---|---|---|---|---|
| 4,015,213 A | | 3/1977 | Hamada | 330/10 |
| 4,415,862 A | | 11/1983 | Kunugi | 330/10 |
| 4,554,512 A | * | 11/1985 | Aiello | 330/10 |
| 4,673,889 A | * | 6/1987 | Cini et al. | 330/10 |
| 4,910,416 A | * | 3/1990 | Salcone | 330/251 |
| 5,613,010 A | | 3/1997 | Heyl et al. | 330/10 |
| 5,617,058 A | * | 4/1997 | Adrian et al. | 330/10 |
| 5,805,020 A | * | 9/1998 | Danz et al. | 330/10 |
| 5,973,368 A | * | 10/1999 | Pearce et al. | 330/251 |
| 5,982,231 A | * | 11/1999 | Nalbant | 330/10 |
| 6,014,055 A | * | 1/2000 | Chester | 330/10 |
| 6,016,075 A | * | 1/2000 | Hamo | 330/251 |
| 6,064,259 A | * | 5/2000 | Takita | 330/10 |
| 6,072,361 A | * | 6/2000 | Myers et al. | 330/10 |
| 6,108,182 A | * | 8/2000 | Pullen | 361/89 |
| 6,118,336 A | * | 9/2000 | Pullen et al. | 330/10 |

OTHER PUBLICATIONS

Copy of International Search Report dated Oct. 26, 1998 from related pending PCT Application No. PCT/US98/14274.

Harris Corporation, APP Note Harris Intelligent Power, Class–D Audio II Evaluation Board (HIP4080AEVAL2), No. AN9525.2, Mar. 1996.

Harris Corporation, APP Note Harris Intelligent Power, HIP4080A, 80V High Frequency H–Bridge Driver, No. AN9404.1, Mar. 1995.

* cited by examiner

*Primary Examiner*—Robert Pascal
*Assistant Examiner*—Khanh V. Nguyen
(74) *Attorney, Agent, or Firm*—Knobbe, Martens, Olson & Bear, LLP

(57) ABSTRACT

An improved class D power amplifier is disclosed. Instead of using prior art triangle waves a ramp signal having a first state of about 90% or greater is used and a second state for the remainder of the cycle. Further, the amplifier includes flip-flops and amplifiers with hysteresis to reduce switching noise. Also, level shifting circuitry is provided for shifting the level of the input signal in response to both DC and AC variations in the power supply and to provide power supply rejection. Still further, multiple channels may be used with all of the channels synchronized to the same timing source.

10 Claims, 15 Drawing Sheets

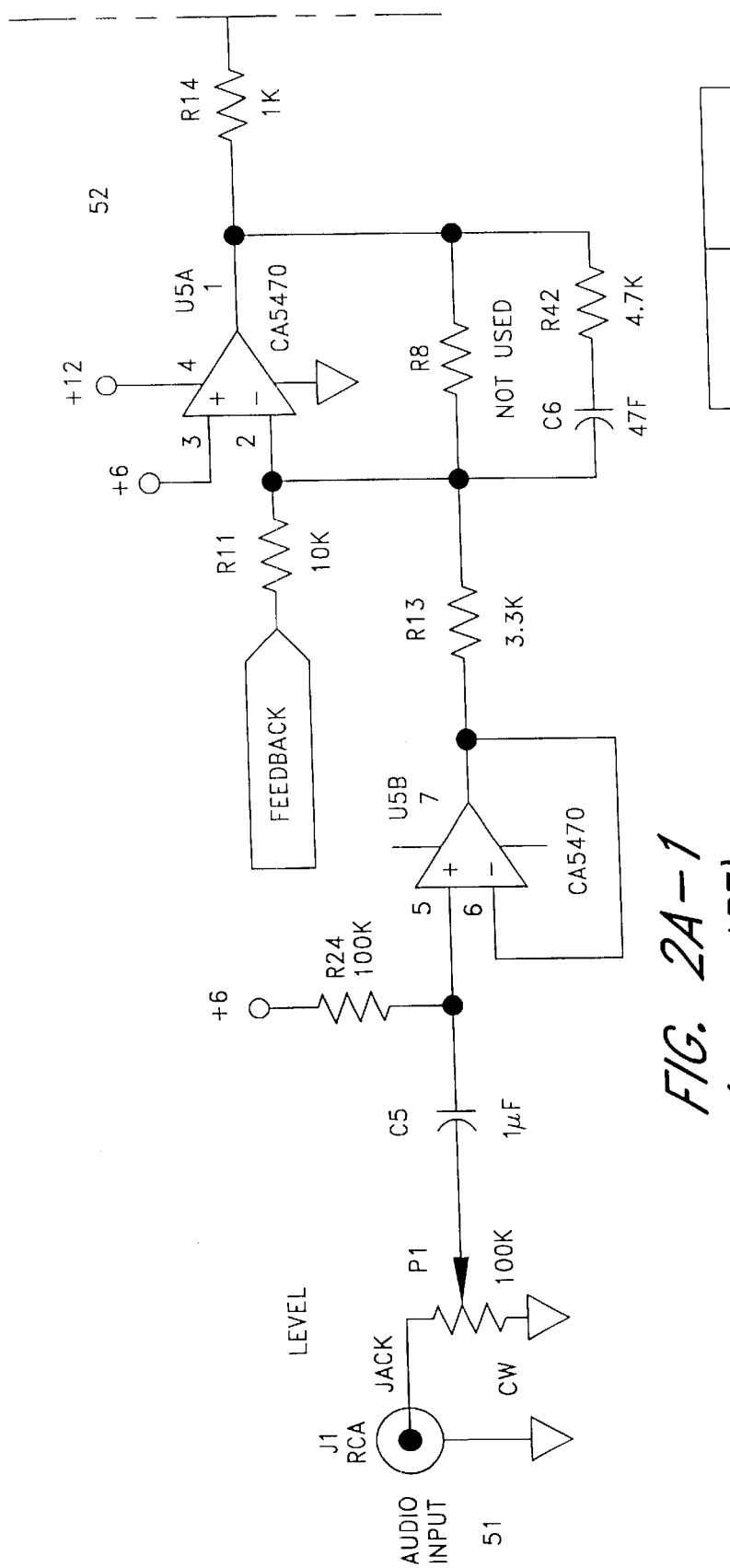
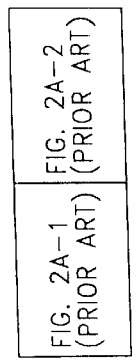
FIG. 2A-1 (PRIOR ART)
FIG. 2A (PRIOR ART)

MULTIPLE CHANNEL CLASS D AUDIO AMPLIFIER

This application is a divisional of U.S. Pat. application No. 08/899,445, filed on Jul, 23, 1997, now U.S. Pat. No. 5,982,231.

BACKGROUND OF THE INVENTION

1. Field of the Invention

This invention relates to class D power amplifiers and more particularly relates to class D power amplifiers for use in low power applications such as in battery powered systems where thermal dissipation is a factor.

2. Description of the Prior Art

Often, audiophile applications use class A or class AB amplifiers to minimize distortion, notwithstanding the high inefficiency of class A and class AB amplifiers. Thus, such amplifiers consume a relatively large amount of power for the amount of power provided to the output. Typically, such amplifiers will dissipate heat energy at least equal to the amount of energy being provided to the load. Thus, cooling of such class A or class AB amplifiers is often an important consideration and requires large (and generally heavy) heat sinks and/or cooling fans. Nonetheless where AC power is available and where weight and size are not crucial factors, high fidelity audio amplifiers use such class A and class AB amplifiers for audio amplification.

Due to their high fidelity, such class A and class AB amplifiers are also used in conventional portable applications such as portable compact disc (CD) players, portable tape players and notebook and subnotebook computers. While such class A and class AB amplifiers will provide output signals with relatively high fidelity, such class A and class AB amplifiers can provide only limited output power. Otherwise, due to their inefficiency, they draw too much power for long term battery operation. Still further, such class A and class AB amplifiers dissipate too much power as heat at high power applications. Heat dissipation in many portable applications such as portable CD players and portable computers creates severe problems in such small units. Therefore, in such portable applications, the power amplifiers are typically limited to less than one-half a watt of output power. As a result, any sound produced by speakers directly driven by such amplifiers will have a relatively low loudness.

However, there has been a recent trend towards using portable computers for multimedia presentations. Since the audio output of the computer is limited due to the restrictions on the power output of the amplifiers, such computers can generally only be used for presentations to a few people. Alternatively, separate powered speakers can be used, but such speakers are bulky and heavy. Therefore, they are often undesirable, not only for laptop and other portable computers, but for desktop and other nonportable computers.

While it might appear that a class D amplifier might be used in lieu of a class A or a class AB amplifier, such class D amplifiers suffer from a number of drawbacks that have limited their utility in audio applications. FIG. 1 shows a typical class D amplifier 10. The input signal 12, which may be an audio signal, is provided to the non-inverting input of a comparator 14. The inverting input of the comparator 14 is coupled to a triangle wave generator 13 that generates a triangle wave symmetric to ground. The output of the class ED amplifier is used to drive a switching bridge circuit such as the bridge circuit 16 shown in FIG. 2 where a first transistor pair Q1 and Q4 are controlled by a driver circuit 15 to conduct simultaneously and a second, complementary transistor pair Q2 and Q3 are controlled to conduct simultaneously. When transistor pair Q1 and Q4 conduct, current from the power supply voltage flows through the loudspeaker 18 in a first direction and when transistor pair Q2 and Q3 conduct, the current through the loudspeaker reverses. Further the transistor pairs are complementary in that when transistor pair Q1 and Q4 conduct, transistor pair Q2 and Q3 do not conduct and vice versa. Thus, the two transistor pairs comprise a full bridge switching circuit. A filter circuit 19 comprised of inductors and capacitors (not shown) serves to transform the current into a substantially sinusoidal signal that varies with the input audio signal, and thereby substantially reproduces the input signal, theoretically.

However, in practice, there are a number of problems associated with such prior art class D amplifiers that prevent the class D amplifier from accurately reproducing the input waveform except for low fidelity applications. In particular, as a practical matter, it is difficult to generate a symmetrical and linear triangle wave. Any lack of symmetry or non-linearity in the triangle wave's waveshape introduces distortion into the output signal. Further, the comparators 14 are subject to switching transients at about the crossover points for the amplitude of the input signal versus the triangle wave. For example, noise and other fluctuations on the signal may cause the output of the comparator to switch back to the prior state temporarily, injecting noise into the output signal.

Still further, the class D amplifier is also subject to power supply perturbations. As the power supply voltage varies, the gain of the amplifier varies. This causes potential frequency instabilities in the performance of the class D amplifier such as in the filters necessary to reproduce audio.

As a result, class D amplifiers are typically not used in applications where good fidelity is demanded such as in portable compact disc players or on notebook computers used for multimedia presentations where total harmonic distortion should be preferably less than 1%. Rather, class D amplifiers are typically used in other applications such as hearing aids where fidelity is not a concern or for driving woofers or subwoofers where the low frequencies mean that typical class D amplifiers will have better performance.

A second prior art audio class D amplifier is shown in FIGS. 2A, 2B, and 2C which is described partially in each of Harris Corporation Application Note No. AN9525.2 dated March 1996 for the Harris Class D Audio II Evaluation Board (HIP4080A EVAL2) and the Application Note AN9404.1 dated March 1995. FIG. 2A shows an audio input 51 that is coupled through an analog summing network 52 to provide an input signal to the pulse width modulation (PWM) comparator 72 (FIG. 2C). The summing network 52 level shifts the input signal to be centered about 6 volts, and sums the audio input signal with the feedback current and a current limit set to limit the output drive current through the bridge 62 in (FIG. 2B). In addition, a symmetrical triangle wave signal is applied to the +input of the PWM comparator 72 to provide pulse width modulation of a symmetric triangle wave. Referring to FIG. 2C, the PWM comparator 72 is applied to delay circuitry 63a and 63b that controls the switching of the bridge transistors so that when transistors Q2 and Q5 are conducting, transistors Q3 and Q4 are not conducting and vice versa. The level shift circuitry 64 is used for shifting the signaling voltages for controlling the high MOSFET's Q2 and Q4 and further "latching" circuitry is used to keep the high transistors Q2 and Q4 conducting even though the output pulse from the level translation circuitry is short for purposes of power reduction.

However, circuits such as those described above, have a number of disadvantages. First, in portable applications such as laptop computers, AC and DC power supply variations cause significant problems in the stability of class D amplifiers. For example, in typical class D amplifiers, the class D amplifier is subject to gain variations as the power supply varies. As the power applied to the sources of the high transistors increases such as transistors Q1 and Q3 above, the gain of the amplifier increases. This can also cause frequency instability in the output filter.

Therefore, the usage of class D audio amplifiers in battery applications has generally been limited to cases where the battery output is stable such as in automobile applications. Further, such class D amplifiers are typically used for high power subwoofers for automobile stereos rather than for broad band audio applications. Gain variations due to power supply variations is not generally a significant factor because the large batteries and the alternators in automobiles generally provide substantially constant power. Further, since the frequency of application is relatively low, under 200 Hz for a typical subwoofer, frequency instability is not a significant problem. Given that low frequency sound is generally omnidirectional, only one channel is needed for the amplifier. Also, in typical automobile applications, power dissipation and form factor is generally not a problem.

As yet an additional problem, in typical portable audio applications such as in notebook and subnotebook computers and in portable compact disc players and tape players, class D amplifiers have not been generally practical. With stereo sound, two channels of audio are needed and there is a need to have the two channels synchronized. With circuits such as the Harris circuits discussed above, the controllers are single channel controllers and synchronization is not believed to be facilitated due to noise and other factors. Also, heat dissipation and form factor are problems as well. Further, given that digital audio provides signals at frequencies of up to 22 KHz, gain stability and power supply effects on stability are believed to be far more problematical.

Still further, the AC and DC variation of the power supply in portable computing applications is also potentially quite large. Since many portable computers and portable music devices are designed to support multiple chemistries for the batteries such as NiCd, lithium hydride and nickel hydride the available power supply can vary between for example 8 volts DC to 25 volts DC depending upon the battery being used. Further, as the battery is discharged, the DC voltage level varies substantially, particularly as the battery nears exhaustion. In addition, AC variations in the battery can be substantial due to the switching power supplies that are used for charging the batteries. Thus, AC fluctuations of several volts can be seen in the power supply voltage in common battery supported applications.

Therefore, it is a first object of the invention to provide a small form factor broad frequency range audio power amplifier. It is a second object of this invention to achieve the audio amplifier with reduced heat dissipation and reduced power draw on the power source. It is yet a third object of the invention to provide DC power supply rejection in such amplifier to minimize gain fluctuations with power supply fluctuations. It is yet a fourth object of the invention to provide such an amplifier with reduced distortion of the signal.

SUMMARY OF THE INVENTION

These and other objects are achieved by a monolithic, dual audio channel integrated circuit using a class D amplifier. To avoid power supply fluctuations in gain, the carrier signal for the pulse width modulators is a sawtooth waveform where the sawtooth is divided into two parts, a rising portion and a falling portion with one of the portions being preferably greater than 90 percent of the period. Further, this longer portion of the period is highly linear. The frequency of the sawtooth waveform is independent of the power supply level but the maxima and slope vary with the power supply to provide power supply rejection.

The right and left audio channels are level shifted to have the inputs referenced at the halfway point between the peak to peak voltage of the sawtooth waveform. In one embodiment, an AC correction factor for ripple and similar effects may also be added. The level shifted signal for each of the right and left channels is then supplied to a separate pulse width modulator comparator having hysteresis where the audio input signal is compared using the comparator. The output of each comparator is coupled to a driving flip-flop to remove switching transients with the Q output of the driving flip-flop controlling the switching of a pair of the bridge transistors and a second Q* output of the driving flip-flop controlling the switching of the other pair of the transistors. The outputs of the flip-flops are coupled to driving logic to ensure that no intermittent short circuits occur with transistors in both pairs conducting simultaneously. By using flip-flops, switching noise from transients is substantially reduced.

Current sensing is also provided to ensure that preset power limits are not exceeded. If the output current exceeds a predetermined threshold, all of the output transistors are turned off for the remainder of the sawtooth signal's cycle. In addition, unlike typical prior art circuits, the current sensing is done between the power supply and the bridge instead of between the bridge and ground, which is more likely to detect partial shorts of the bridge transistors.

DETAILED DESCRIPTION OF THE PREFERRED EMBODIMENTS

Figure 1:
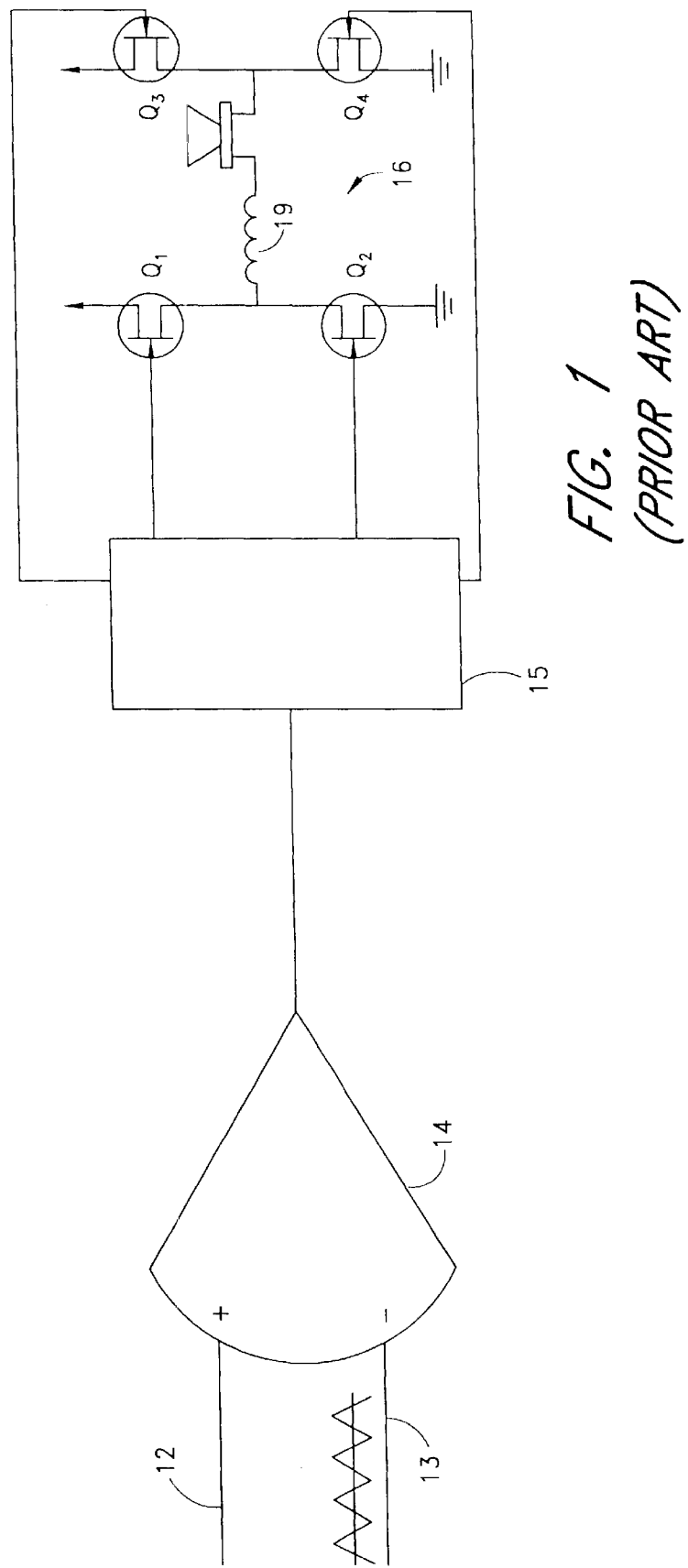
FIG. 1 is a simplified schematic of a prior art class D amplifier.
Figures 2, 2A:
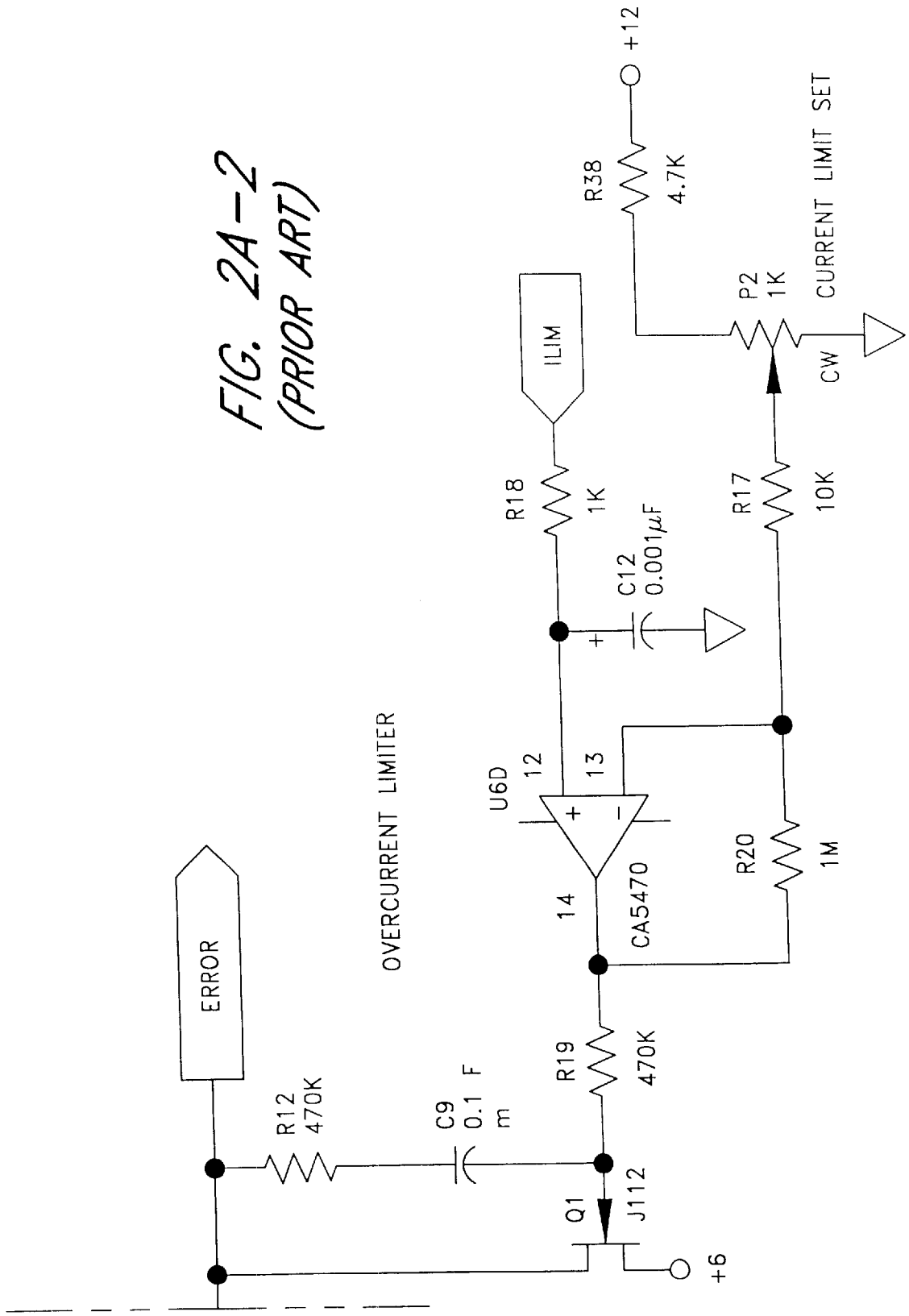
FIG. 2A, B and C are schematics of a prior art class D amplifier.
Figures 1, 2B:
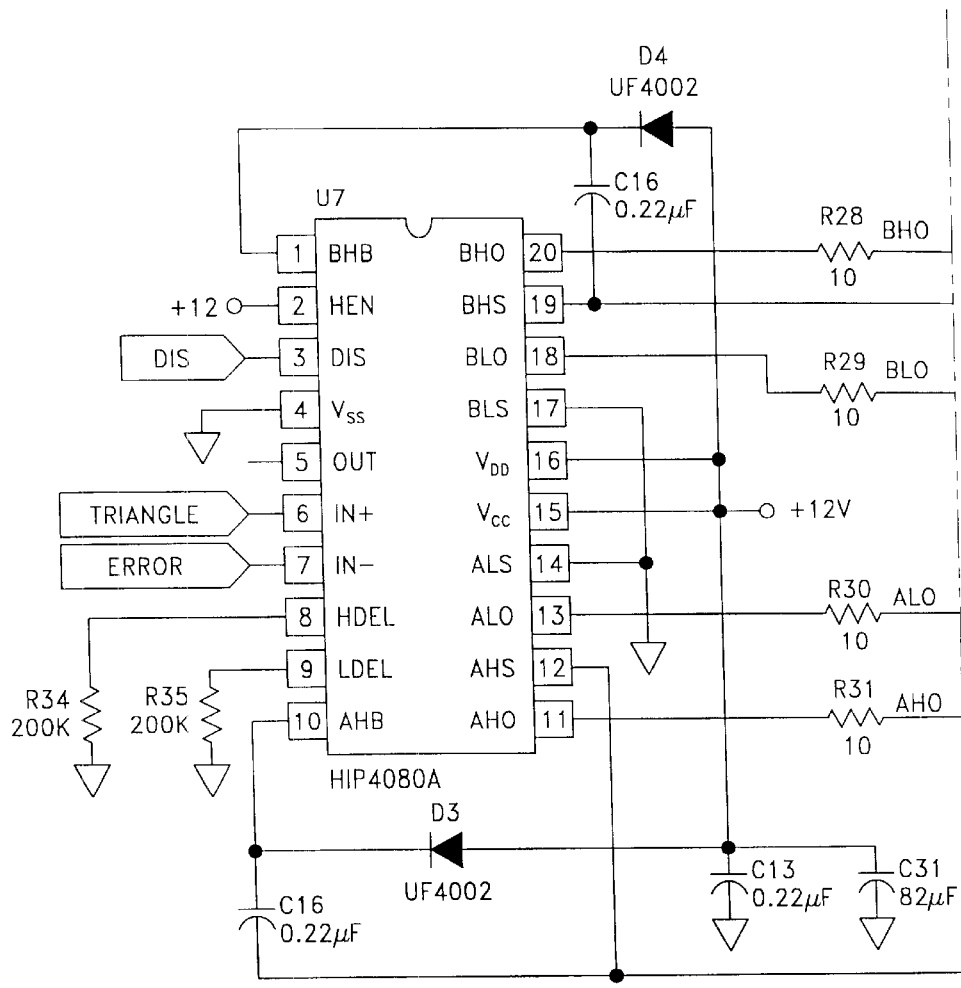
Figure 2B:
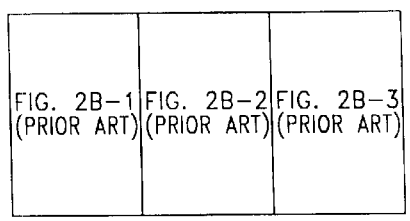
Figures 2, 2B:
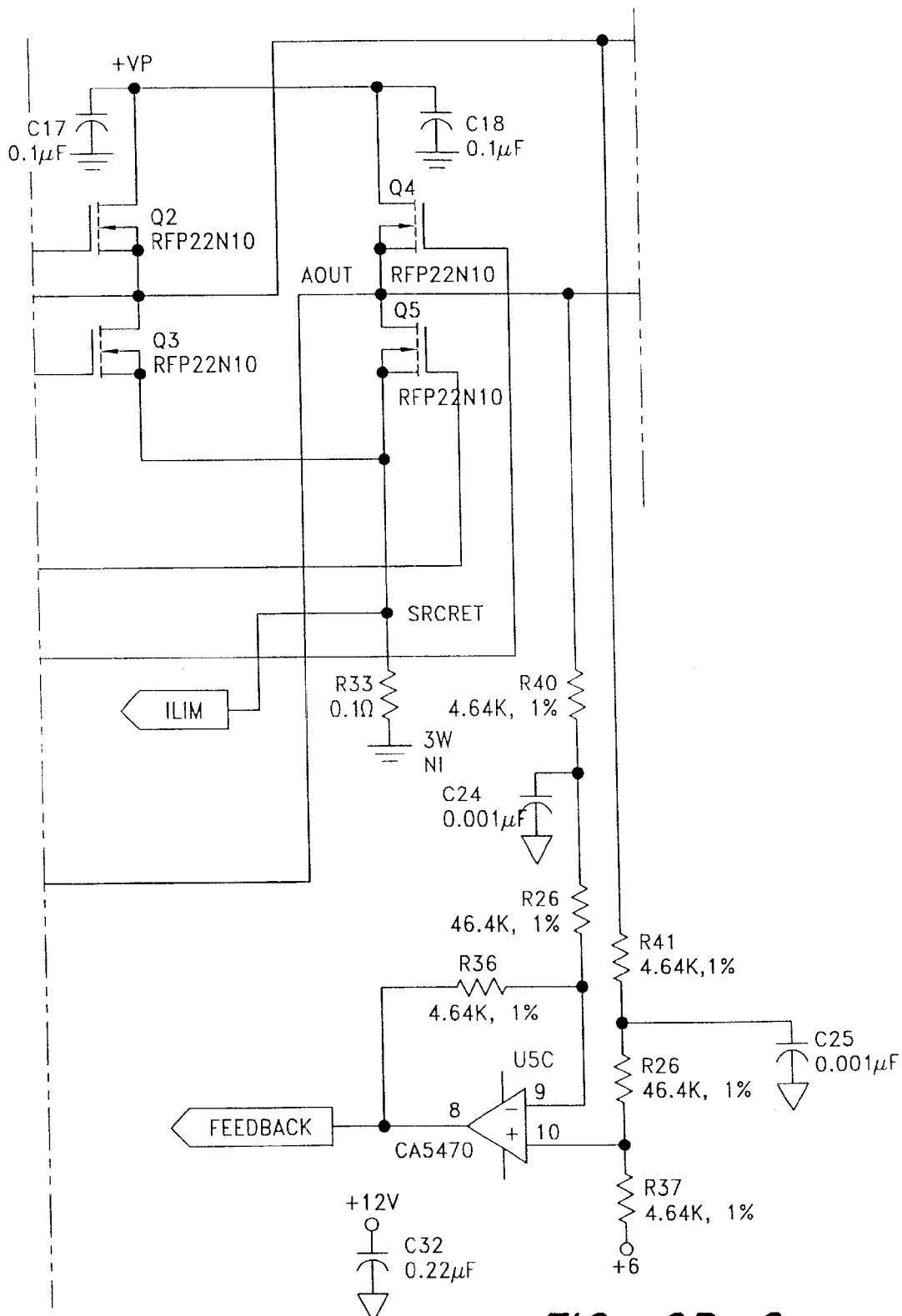
Figures 2, 2B, 3:
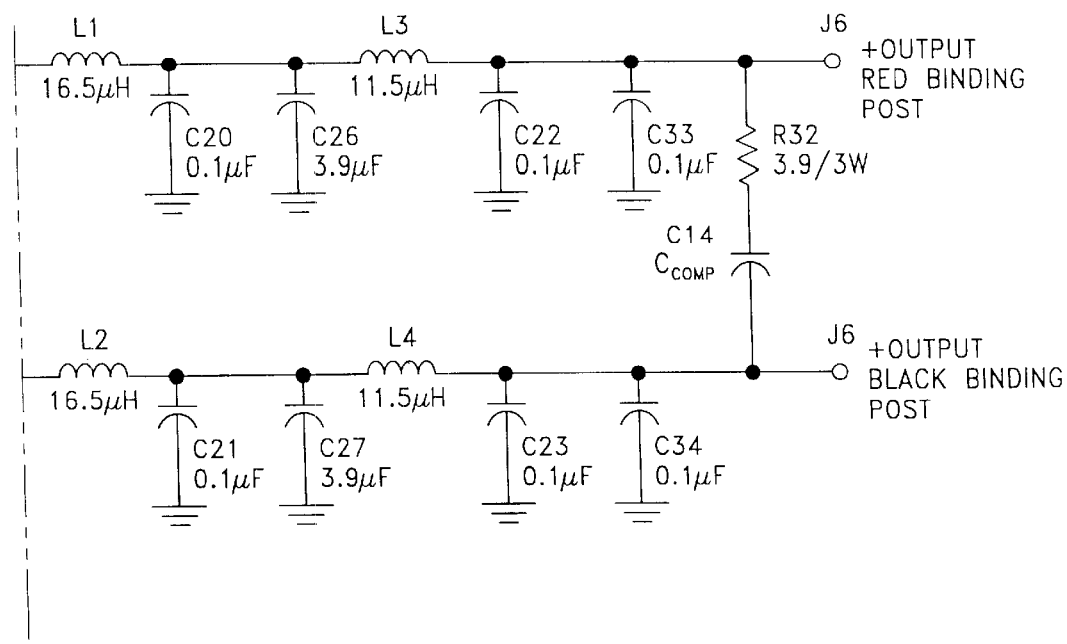
FIG. 3 is a block diagram of a first embodiment of the invention.
Figure 2C:
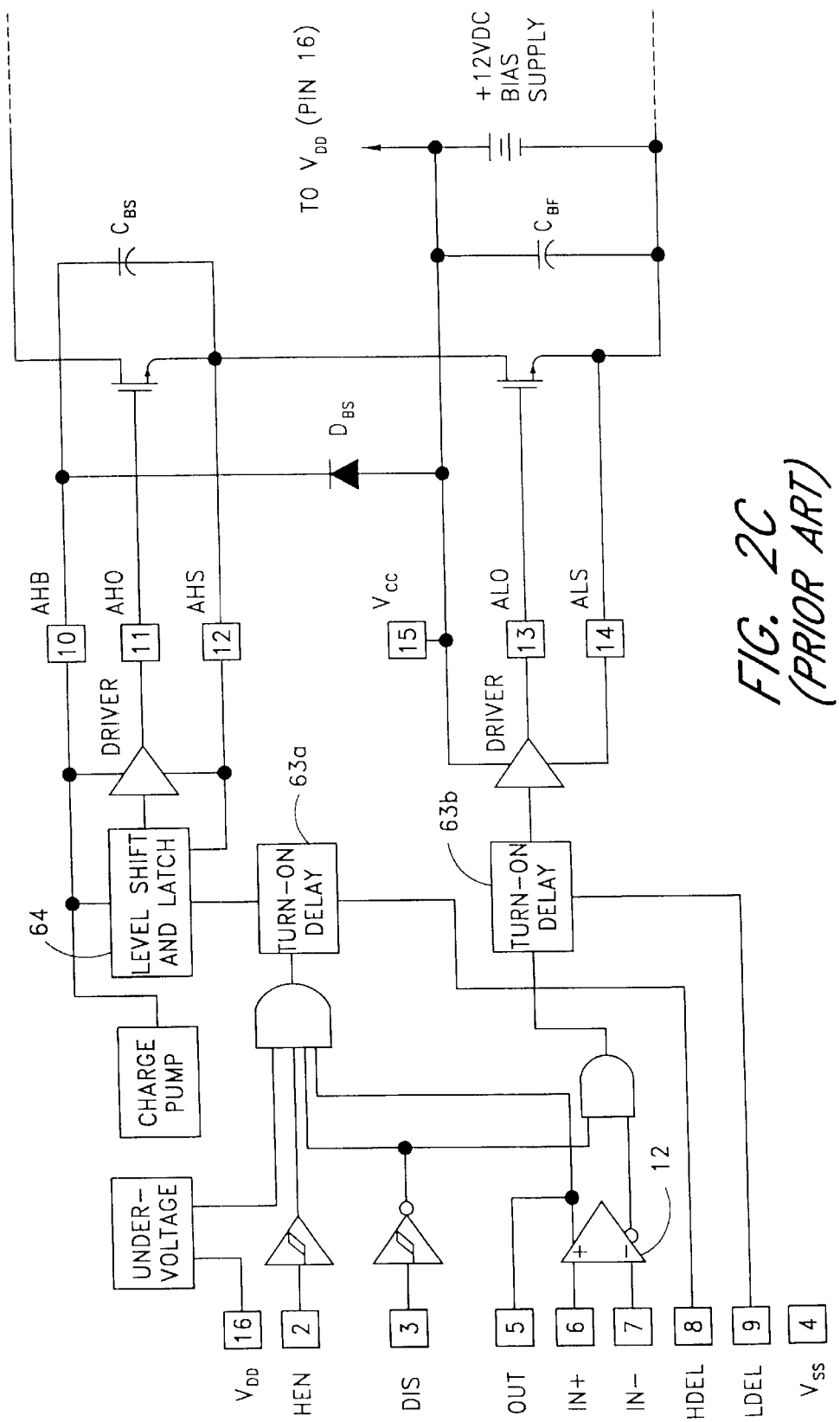
Figure 3:
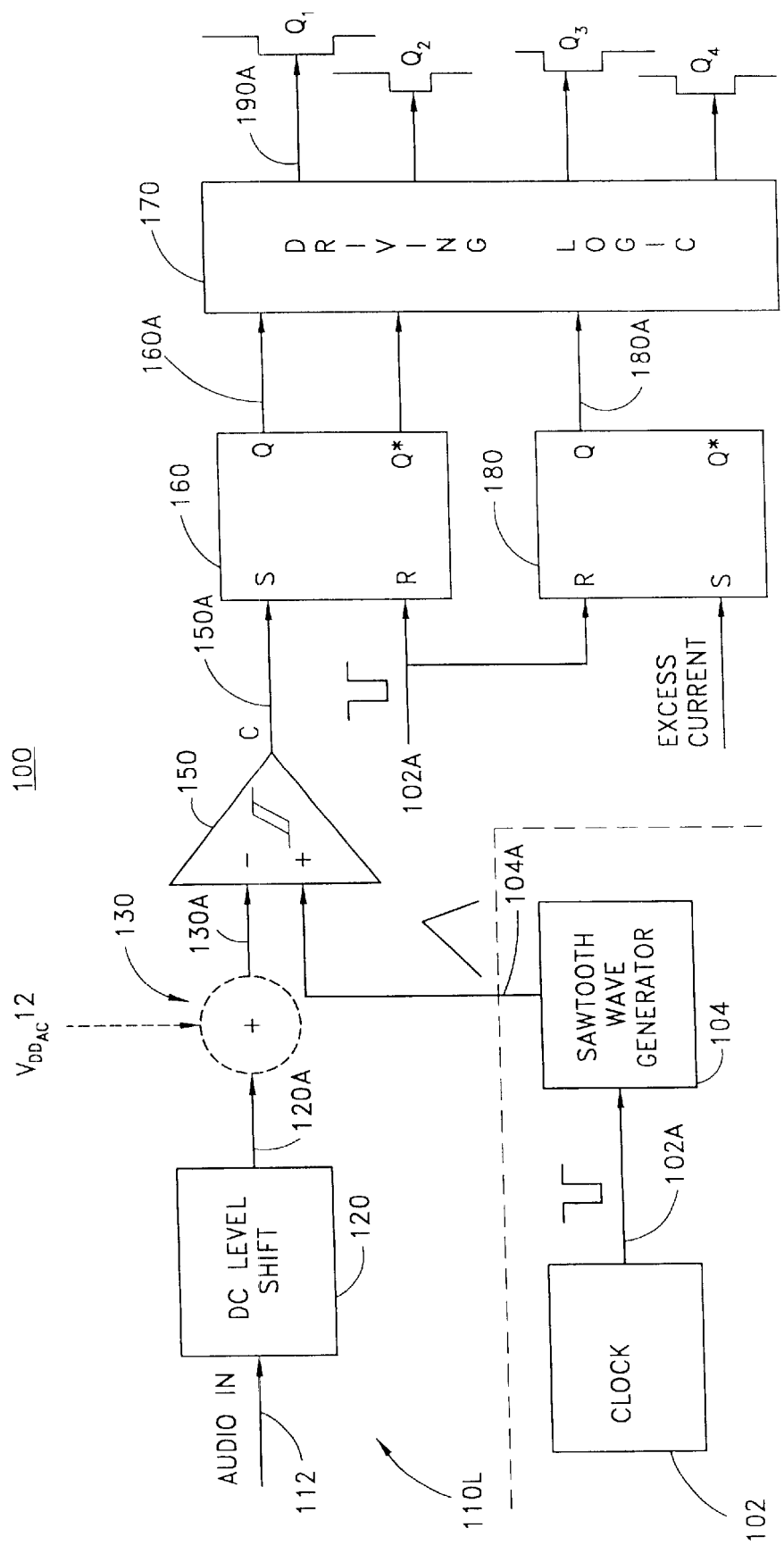

FIG. 3 shows a block diagram of a first embodiment 100 of the invention with only one of the two audio channels 110 shown with a second channel, the output filter, load and certain feedback features omitted for purposes of clarity. A clock oscillator circuit 102 drives a sawtooth signal generator 104 at a relatively high frequency of preferably about 330 KHz or greater. The sawtooth signal generator 104 generates a sawtooth signal 104A (see FIG. 4) having a rising portion 104A-1 and a falling portion 104A-2 so that a first of the portions of the signal (shown as the rising portion 104A-1 in FIG. 4) lasts for at least about 90% and preferably about 95% of the period 104A-T of the sawtooth signal. To avoid distortion, the longer portion (here 104A-1) of the signal should be as linear as possible with the period of the signal and the relative durations of the two portions of the signal being unaffected by variations in the power supply voltage. However, at least the maxima and the slope of the sawtooth comparison or modulated signal may vary with the power supply voltage to provide rejection of power supply noise and frequency stability. Further the peak of the sawtooth waveform should vary with the power supply voltage to thereby eliminate the gain variations caused by power supply changes in typical class D switching amplifiers.

The input audio signals 112 are provided to DC level shifting circuitry 120 so that the output of the DC level shifting circuitry 120A is centered about ½ the peak to peak voltage $V_{p-p}$ of the sawtooth signal 104A. As indicated in phantom, in an alternative embodiment, AC level shifting circuitry 130 may optionally be provided to shift the output of the DC level shifting circuit by ½ of the AC component on the supply voltage. That AC component may be power supply ripple or noise or may be the effects of switching battery chargers and hence is a much lower frequency than the clock frequency or sawtooth signal. Typically, these variations will have a frequency of about 2 KHz or less. The output of the DC level shifting circuitry 120A (or 130A), which is the audio input signal centered around ½ $V_{p-p}$ then pulse width modulates the sawtooth wave by the pulse width modulation comparator 150. Preferably, the comparator 150 has hysteresis so that when the inputs to the comparator are about equal, transients do not induce switching noise. To further reduce the switching noise of the amplifier, the output 150A of the comparator is then provided to the pulse width modulation flip-flop 160, which preferably is an S-R flip-flop. The Q and Q* outputs of the S-R flip-flop 160 are coupled to the driving network 170 to provide complementary switching by the first transistor pair Q1 and Q4 to provide conduction through the loudspeaker (not shown) or other load in one direction when Q is high for example and the other pair of transistors Q2 and Q3 to provide conduction for example when Q* is high providing conduction in the other direction. Further, the driving gates include logic so that transistors Q1 and Q2 will never conduct simultaneously and transistors Q3 and Q4 will never conduct simultaneously. Thus, the waveform for the gate of the transistor Q2 will be substantially the complement of the waveform 190A for the gate of the transistor Q1.

In addition, current sense circuitry (not shown) provides sensing of the output current and determines if the current has exceeded a predetermined threshold. When the current has exceeded a predetermined threshold, the output of a current sense flip-flop 180 changes state, causing all of the switching transistors Q1 through Q4 to cease conducting for the remainder of the clock cycle.

When the clock pulse goes low, all of the flip-flops are reset. Preferably, the duty cycle of the low portion of the clock is very low, such as 5% or less or of the clock period . Further, the frequency of the clock should be about an order of magnitude greater than the highest frequency component of the input signal. For example, if the audio signal is generated from a sampled input signal such as compact disc quality sound with audio signals having an upper frequency limit of about 22 kHz sampled at 44 KHz pursuant to Nyquist's theorem, the clock frequency is preferably at least 330 KHz and in some applications may be above 600 KHz.

Figure 4:
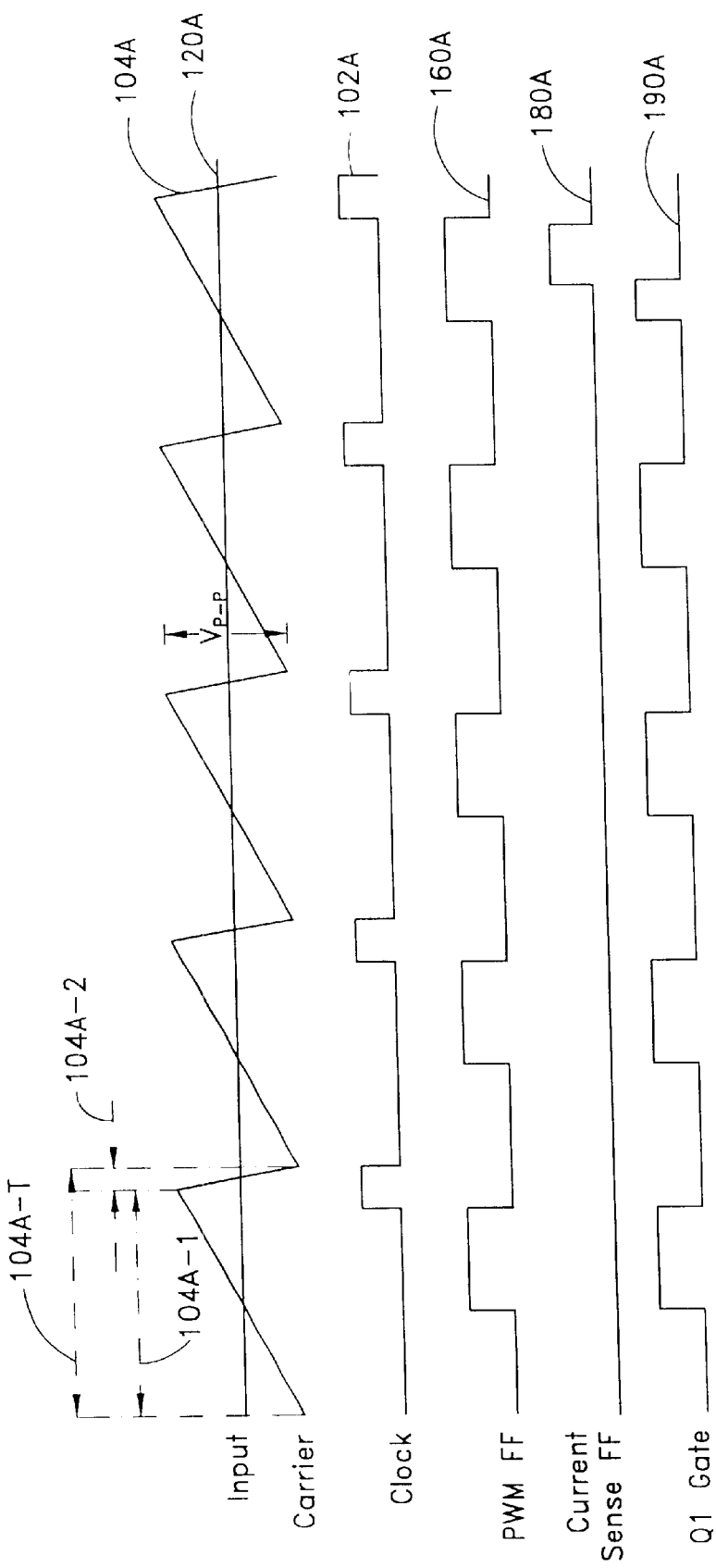
FIG. 4 is a timing diagram for the embodiment of FIG. 3.

FIG. 4 shows the timing diagram of the embodiment with the level shifted input signal 120A superimposed on the sawtooth carrier 104A, the clock output 102A, the PWM FF Q output 160A and current sense flip-flop output waveform 180A where the current exceeds a predetermined limit such as 2½ amps. In this case, the input signal is shown to be about zero and level shifted to be about ½ $V_{p-p}$ for purposes of explanation but in actual implementations, the input signal will vary over several cycles of the input signal. As can be seen in FIG. 4, during the first portion 104A-1 of the sawtooth carrier 104A, when the amplitude of the level shifted input signal exceeds the amplitude of the sawtooth carrier 104A, the output 160A of the PWM flip-flop 160 goes high. Switching noise, however, is avoided because even if there is a transient on the input to the comparator 150, the hysteresis of the comparator 150 and the PWM flip-flop 160 provide a clean edge at the output 160A for switching the transistors Q1 through Q4. Still further, the output 160A of the PWM flip-flop 160 remains high until the clock signal 102A goes high, resetting both flip-flops 160 and 180. The gate waveform 190A for transistor Q1 goes high when the Q output 160A goes high and remains high until the second portion 104A-2 of the sawtooth carrier 104A. Further, if the current exceeds the predetermined limit, the Q output 180A of the excess current flip-flop 180 goes high, thereby causing all of transistors Q1 through Q4 to turn off, and reduce the current draw.

Not only does the use of the hysteresis amplifier reduce switching noise from transients but still further the S-R flip-flop, which is coupled between the output of the comparator and the driver circuit further reduces noise. In particular, once the output of the comparator changes state in each period of the sawtooth signal, the output of the flip-flop will remain fixed until the clock goes high at the beginning of the next cycle. Hence, the switching noise caused by transients and noise is effectively removed from the control signals to the transistors as opposed to prior art designs.

Although the embodiment of FIG. 3 only shows one channel 110 such as the left channel, there will also be a preferably identical right channel (not shown) driven by the same clock and sawtooth waveform with identical level shifting circuitry, comparator, flip-flops and driving circuitry to drive a separate switching bridge network. As a result, the two signals are synchronized so that they may be more readily used for stereo. In addition, the two channels and the clock and sawtooth generator are preferably fabricated on one integrated circuit so that noise from the environment has less effect on the clock and sawtooth signals, thereby permitting stereo operation. Further, for surround sound capability, additional channels may be fabricated on the integrated circuit.

Figures 5, 5A:
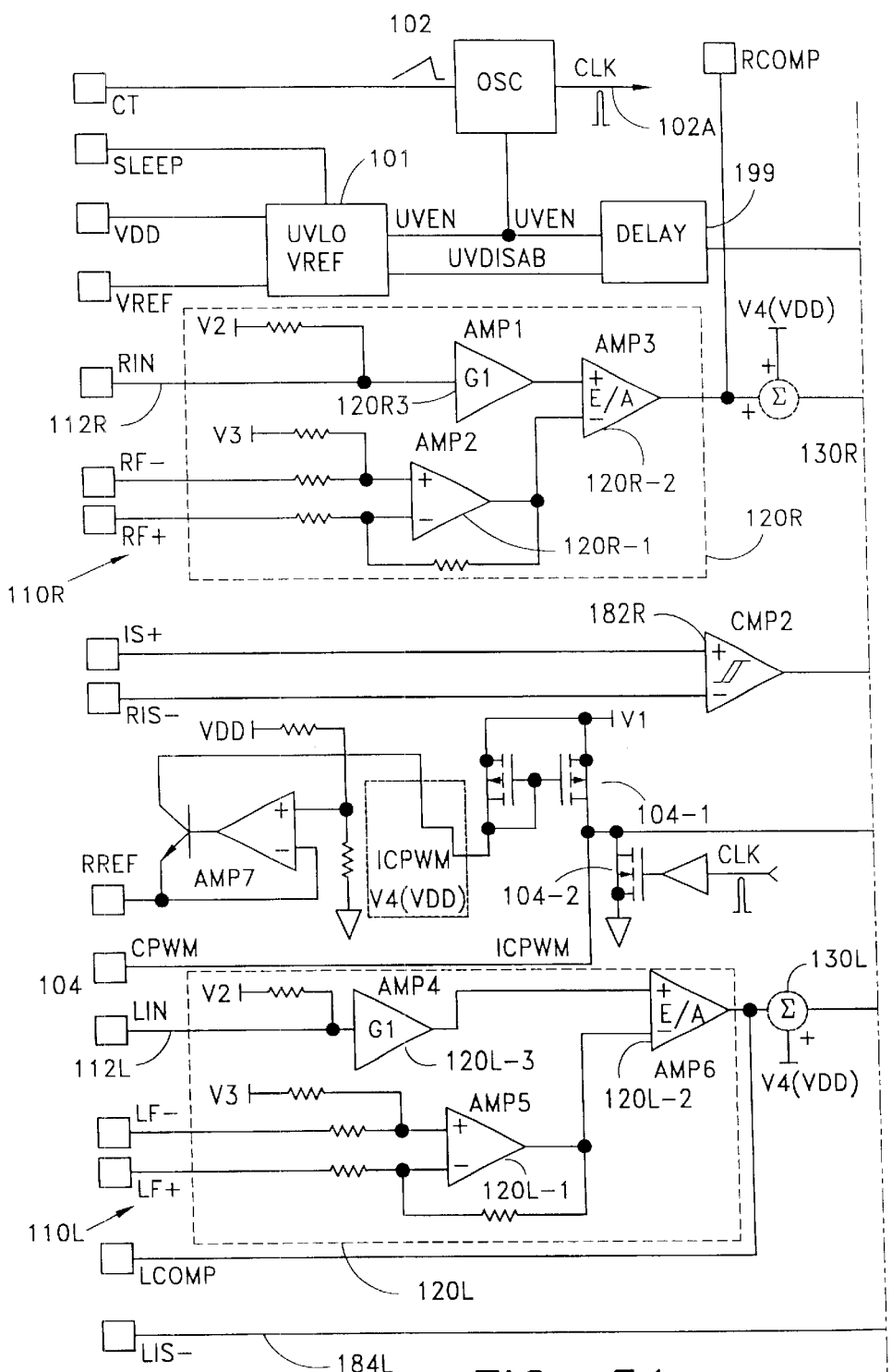
FIG. 5 is a detailed schematic of an embodiment of the invention.
Figure 5B:
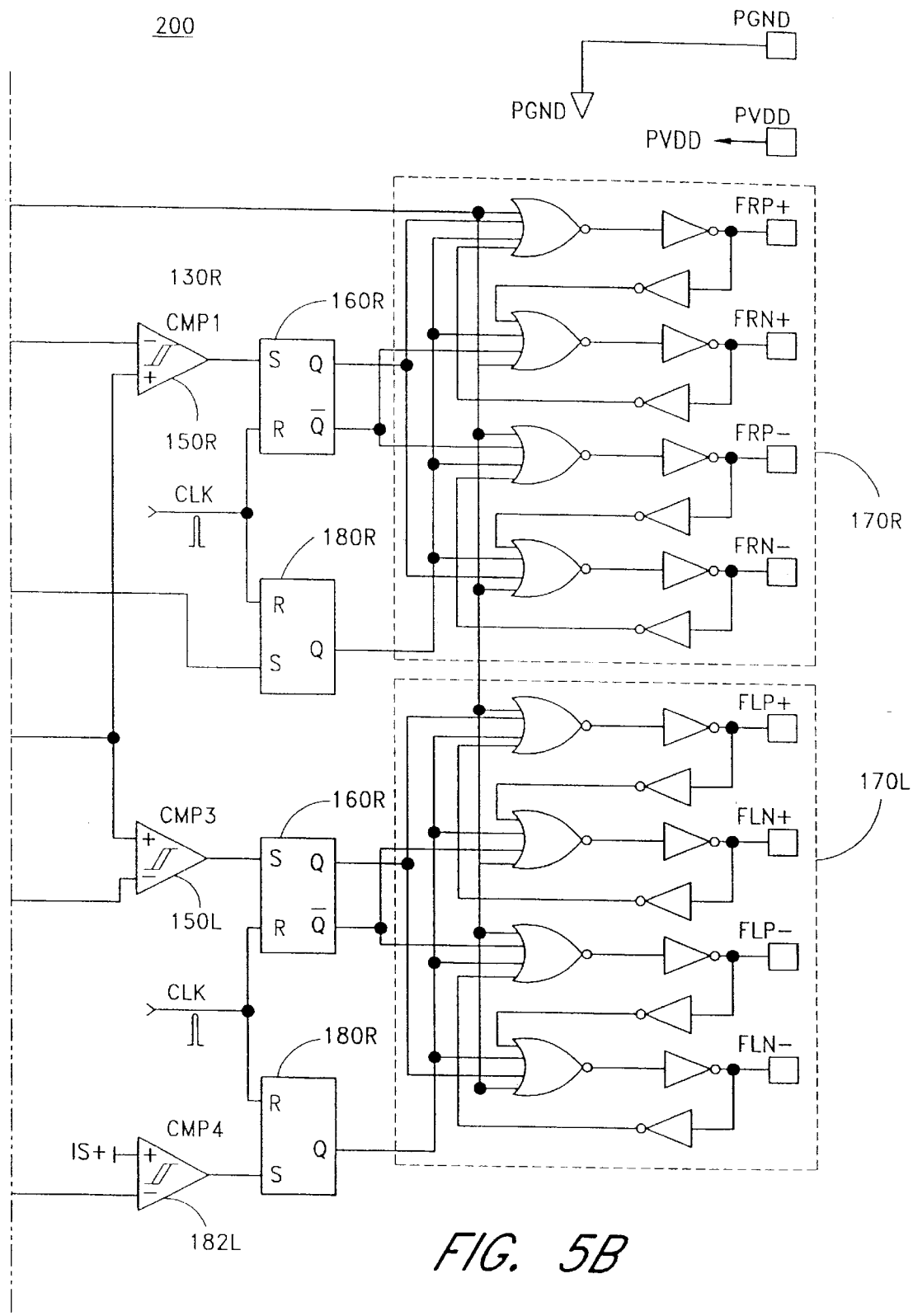

FIG. 5 is a more detailed schematic 200 with additional circuitry indicated for a monolithic integrated circuit approach that may be implemented using bipolar technology for a dual channel configuration. Alternatively, using a BICMOS process, the circuitry of FIG. 5 may be implemented with the driver transistors located within the monolithic transistor.

In the circuitry of FIG. 5, the clock generator 102 may be a conventional square wave clock generator having a frequency of about 330 kHz with a duty cycle of less than 10% and preferably less than about 5% to provide a very short duration clock pulse. An external timing capacitor $C_T$ (FIG. 6) is coupled to the input labeled $C_T$ in FIG. 5 that sets the clock's operational frequency. The clock 102 drives the sawtooth wave generator 104 that includes an external timing capacitor coupled to $C_{PWM}$. The sawtooth generator 104 generates a current based upon an external reference resistor coupled to $R_{REF}$ and to the power supply. Thus, this current, which is first generated by AMP 7 varies with $V_{DD}$ and with the external resistor. The slope of the longer portion of the sawtooth signal is determined by the reference current generated thereby and the magnitude of the external capacitor $C_{PWM}$. If AC correction is desired, an ICPWM block (shown in phantom) generates a reference voltage V4, which is a function of the AC variations of $V_{DD}$, below about 2 KHz. A filtered version of the current generated by AMP 7 below 2 KHz is mirrored by a current mirror 104-1 to provide a current that varies linearly with variations in $V_{DD}$. The current charges the external capacitor $C_{PWM}$ with a constant current during a first (rising) portion 104A-1 so that the voltage during the first portion 104A-1 across the capacitor CPWM varies linearly as a function of time. During the second portion 104A-2, when the clock pulse goes low, the discharging switch 104-2 discharges the capacitor. Since the clock has a low pulse with a duty cycle of less than 10%, the second portion 104A-2 (falling portion) is also less than 10% of the sawtooth signal's period. Thus, the duty cycle of the clock controls the relative durations of the rising and falling edges. Further, since the magnitude of the current provided by AMP7 varies with the supply voltage $V_{DD}$, the magnitude of the peak voltage and the slopes of the sawtooth signal will vary with the supply voltage. As explained below, this provides power supply rejection.

The circuit of FIG. 5 has both right and left channels, which are both driven by the same sawtooth generator 104 to provide synchronization of the pulse width modulation flip-flops 160R and 160L. The DC shifting circuit 120R, 120L includes amplifiers 120R-1 and 120L-1 that take the DC level across the load from inputs RF+, RF− and LF+, LF− and force that level to be approximately 0 at the outputs of amplifiers 120R-1 and 120L-1 respectively. Amplifiers 120R-3 and 120L-3 level shift the input signals for each channel at RIN and LIN respectively to a reference level generated by an under voltage/voltage reference generator 101. Error amplifiers 120R-2 and 120L-2 cooperate with difference amplifiers 120R-1 and 120L-1 to force the output of the power bridge to be centered at ½ of the DC level of $V_{DD}$. The outputs of 120R and 120L are coupled to external compensation circuits at RCOMP and LCOMP respectively to provide frequency stability.

In another feature of the present invention the output drivers are the last circuits to be enabled at power up and are the first circuits to be disabled at power down. It has been noted by the present inventor that such an arrangement can prevent a popping sound which is believed to be generated by audio amplifiers if the output drivers are enabled before the control logic or if disabled after the control logic is disabled. Thus, the enable signal UVEN generated by the undervoltage lock out circuit 101 at power up is delayed by a delay circuit 199 for a sufficient time period (such as 1 millisecond, for example) to permit the logic circuitry controlling the driving logic 170 to be enabled before the driving logic 170 is enabled by the signal UVEN (delayed). Conversely, the disable signal UVDISAB is provided by the undervoltage lock out circuit 101 to the circuit 199 which disables the driving logic 170 prior to any of the control logic controlling the driving logic 170. The internal construction of such a delay circuit 199 to implement the timing scheme described above may be implemented using analog or digital delay devices known to those skilled in the art.

It AC perturbation correction is desired, the outputs of the level shifting circuits 120R and 120L are provided to analog summers 130R and 130L (shown in phantom) where a voltage $V_4$ proportional to $V_{DD}$ is summed with the output of AMP3 (or AMP6) to provide instantaneous rejection of power supply perturbation. Comparators 150R, 150L, flip-flops 160R, 160L, driver circuit 170R and 170L, and flip flops 180R, 180L operate in the manner described above. Current sense comparators 182R, 182L generate the current sense signals when excessive current flows through the external transistors such as greater than 2½ amps as sensed at inputs at RS and LS respectively for each channel separately. Preferably, the circuit of FIG. 5 is a monolithic integrated circuit.

Figure 6A:
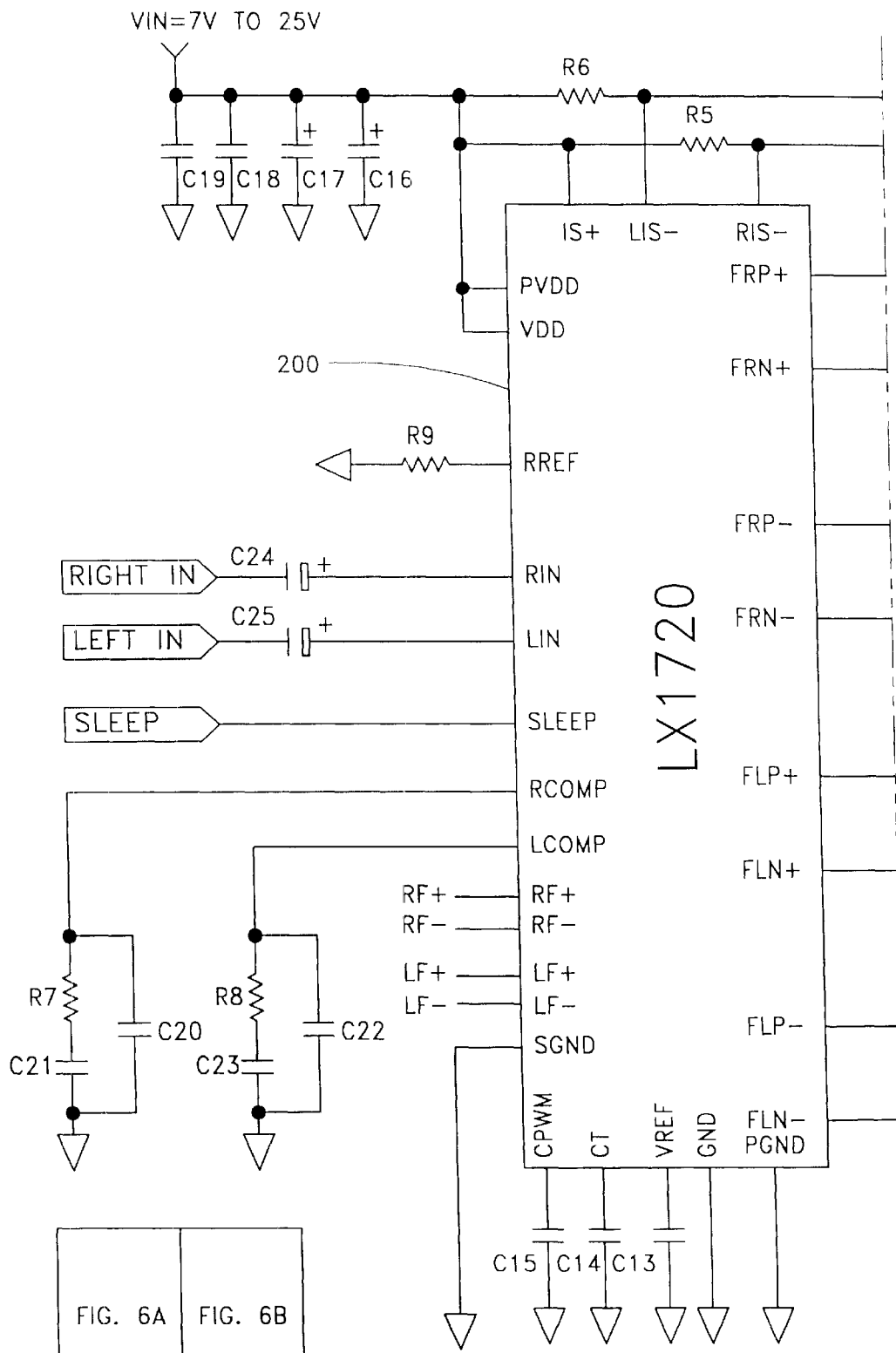
FIG. 6 is a schematic of the external circuitry for an embodiment of the invention.
Figure 6B:
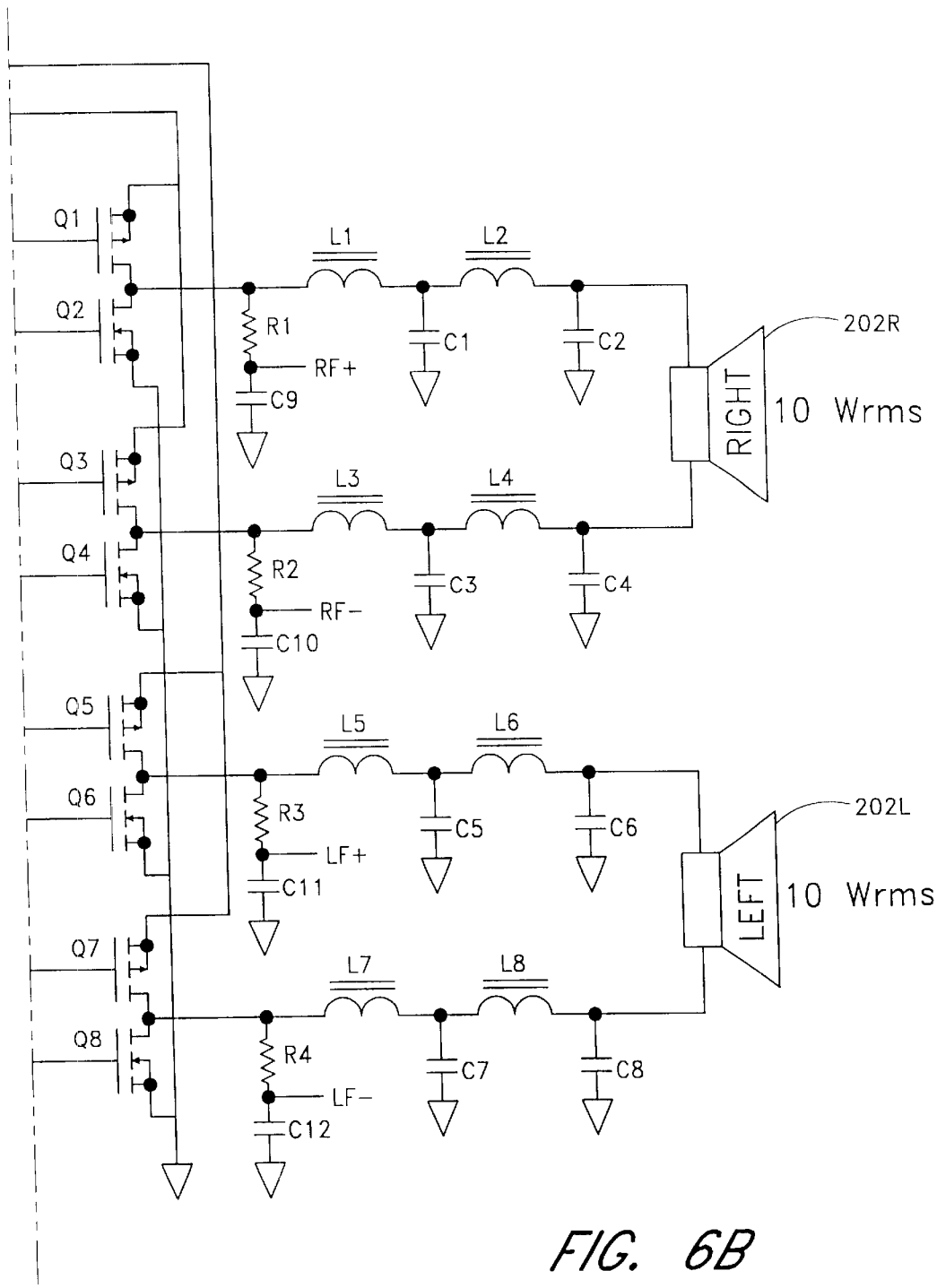

FIG. 6 shows a typical external circuit that may be used with the circuit of FIG. 5. The right and left loudspeakers 202R, 202L are driven by full bridge switching circuits comprised of transistors Q1 through Q4 and Q5 through Q8 respectively, which may be 0.1ΩS0–8 FET's available from Siliconix or International Rectifier, preferably in surface mount packaging. Each speaker load 202R, 202L, has a four pole filter as shown to reject the switching noise from the transistors of the bridge and other noise that might be generated by, for example, computer busses. Further, external resistors R1, R2, R3, R4, and external capacitors C9, through C12 provide low pass filters that provide feedback inputs RF+, RF−, LF+ and LF− that provide the audio level at the junction of switching transistors Q1 and Q2, Q3 and Q4, Q5 and Q6, and Q7, and Q8, respectively. She values of resistors R1 through R4 and capacitors C9 through C12 are unimportant as loner as the resistances and capacitances for each channel are substantially the same and the RC time constants are long enough to provide substantial rejection of the AC components at the outputs. In cooperation with the amplifiers 120R-1 and 120L-1, this causes the amperage voltage difference across the four pole filters to be level shifted to a DC reference voltage V3, which may be ½ $V_{DD}$. The outputs of amplifiers 120R and 120L represent the average duty cycle of the comparators 150R and 150L, respectively.

The resistors R7 and R8 and capacitors C20 through C23 provide compensation for amplifiers 120R and 120L. Coupling capacitors C24 and C25 provide AC coupling while external resistor R9 sets the reference current based upon the DC voltage for the sawtooth signal.

Further, resistors R5 and R6 are external current sense resistors. Since these resistors are coupled between the power supply voltage and the different switching bridges, the current for each bridge is independently sensed so that a short or excess current condition on one channel does not interfere with the operation of the other channel. By sensing the current between the power supply and the bridge instead of between the bridge and ground, detection of shorts and partial shorts is more likely to occur.

Figure 7A:
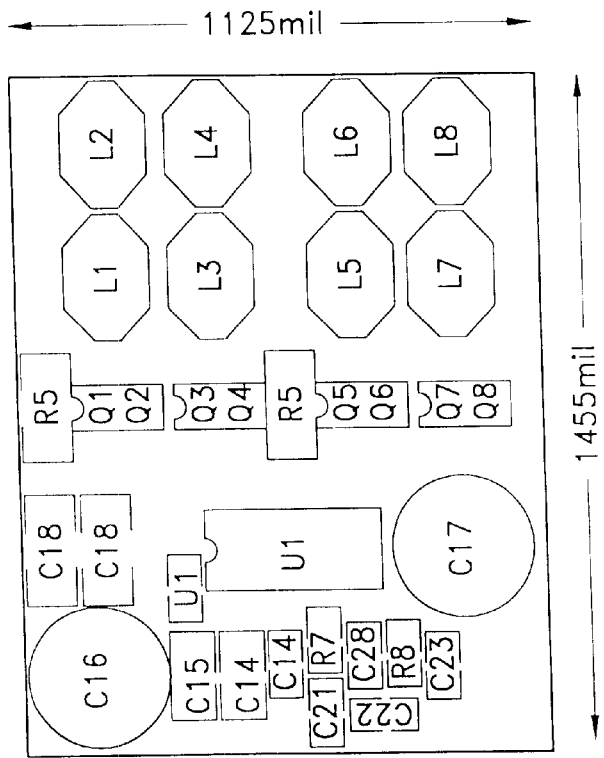
FIGS. 7A and 7B a drawing showing the layout of the embodiments of FIGS. 5 and 6 on a printed circuit board.
Figure 7A:
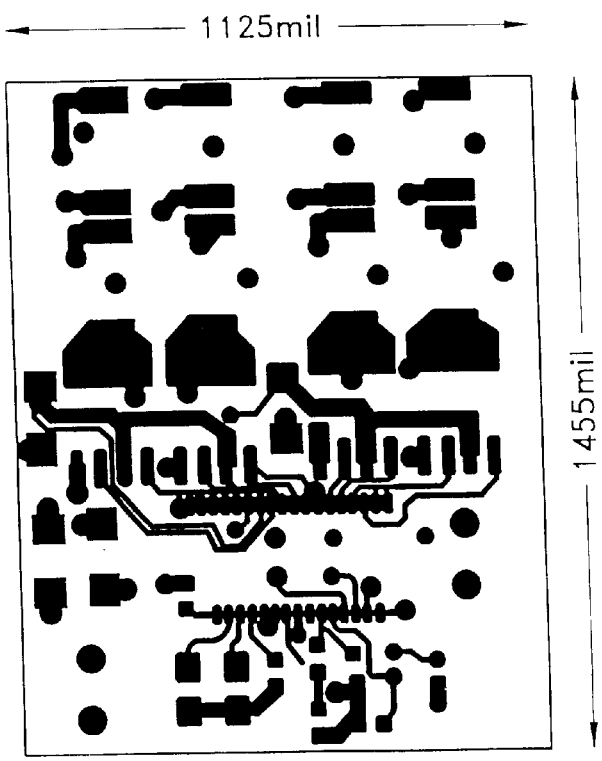
Figure 7B:
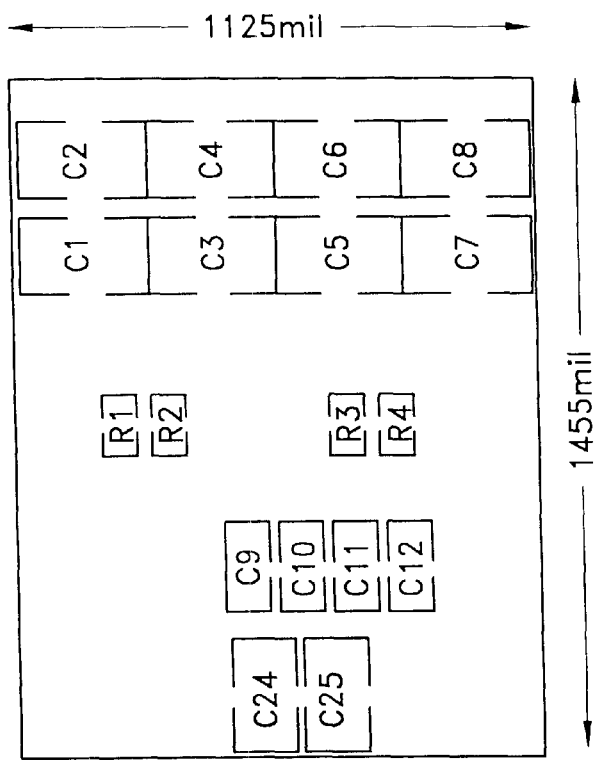
Figure 7B:
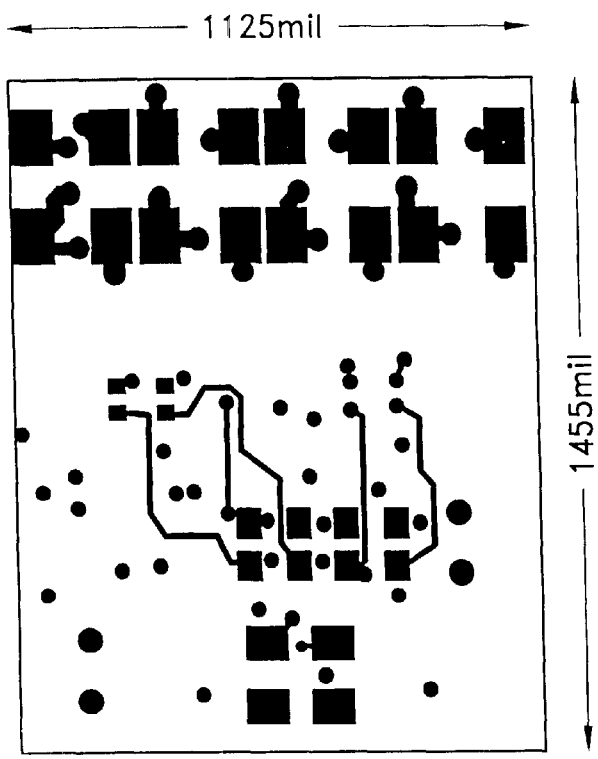

Further, as shown in FIG. 7, a layout for a printed circuit board shown in FIGS. 7A and 7B is suitable for use in a personal computer along with a graphical depiction of the board with the components installed. The printed circuit board may have a size of 1455 mils by 1125 mils (i.e. approximately 1½ inches by 1⅛ inches) and a height of about ⅛ inch with the circuit 200 of FIG. 4 contained in a surface amount IC and external surface mount components including button inductors as graphically depicted in FIGS. 7C and 7D. The capacitors are preferably 0.2 to 0.5 μf (ceramic or metal film). Further size reduction could be attained by using a two pole filter design so that only two inductors are needed per channel and by integrating the switching bridge transistors onto the integrated circuit, even more compact designs may be attained.

Through the use of this unique class D dual channel amplifier, a high power output density can be attained. Not only is the amplifier compact, but given its high efficiency in excess of 92%, this circuit is suitable for multimedia applications having a limited power supply available. Further, a high switching frequency of 330 KHz or greater permits a substantial reduction of the size and weight of the external filter components. By providing a highly linear ramp signal, total harmonic distortion can be reduced to 0.5% or less. By switching to a higher frequency with even a shorter duty cycle for smaller portion of the pulse, even greater linearity can be attained. In addition, the circuit is highly immune to gain effects due to power supply variations. Because of the high efficiency, twenty watts per channel or more may be delivered to the loads housed within small packages where other components contribute significant heat to the thermal consideration without use of heatsinks. Thus, the circuit also may be used in other high fidelity applications requiring low power consumption and needing high power output such as battery powered compact disc players, digital audio tape, and DVD players. However, it is anticipated that the circuit is also useful for nonportable applications including desktop computers.

In addition, it is also possible to reduce distortion by using a digital approach in which the DC level shifting circuitry 120, comparator 150 and sawtooth wave generator 104A may be replaced with digital circuits, for example.

As a result of the disclosed embodiments, a high performance class D amplifier is provided that is suitable for use in multimedia applications. Given the high efficiency of the amplifier, loads can be driven at a high power such as greater than 10 watts RMS without heat sinks and in environments such as notebook computers where thermal efficiency is critical.

Of course, modifications of the disclosed embodiments will be apparent to those of skill in the art. For example instead of providing just two channels of audio, three or more channels may be provided such as is needed for so-called surround sound systems available from Dolby Laboratories and other sources. In such case, more channels are provided, with the same sawtooth signal being provided to the comparators of each channel. In addition, half bridge switching circuits may be used, but in that case efficiency and maximum output power will be effected. Of course, other filters may be used instead of two and four pole filters. Therefore, the scope of the invention should be measured according to the claims.

I claim:

1. An amplifier control circuit comprising:
   a control circuit configured to pulse width modulate an input signal;
   a driver circuit configured to receive an output of the control circuit and to control switching transistors;
   a clock generator configured to generate a clock signal, wherein the clock signal enables operations in the control circuit;
   an enable circuit configured to generate an enable signal at power up, wherein the enable signal enables the clock generator; and
   a delay circuit configured to delay the enable signal to the driver circuit so that the driver circuit is enabled after the control circuit is enabled.

2. The circuit of claim 1, wherein the enable circuit generates a disable signal at power down, and the disable signal is provided to the driver circuit prior to the control circuit.

3. A method of amplifying an audio input signal, the method comprising:
   generating a clock signal;
   generating an enable signal to start the generation of the clock signal at power up;
   enabling a control circuit which pulse width modulates the audio input signal using the clock signal; and
   delaying the enable signal to a driver circuit coupled to the output of the control circuit so that the driver circuit is enabled after the control circuit is enabled, wherein the driver circuit drives switching transistors to produce an amplified version of the audio input signal.

4. The method of claim 3 further comprising:
   generating a disable signal at power down; and
   providing the disable signal to the control circuit after the driver circuit.

5. An audio amplifier comprising:
   a clock oscillator circuit;
   a sawtooth signal generator coupled to an output of the clock oscillator circuit;
   a comparator which compares an input audio signal with an output of the sawtooth signal generator;
   a flip-flop which receives an output of the comparator and the output of the clock oscillator circuit;
   a driving network which receives an output of the flip-flop;
   an enable circuit which produces an enable signal at power up, wherein the enable signal starts the clock oscillator circuit; and
   a delay circuit which delays the enable signal to the driving network so that the driving network is enabled after a delay period.

6. The audio amplifier of claim 5, wherein the clock oscillator circuit oscillates at a predetermined frequency which is an order of magnitude greater than a highest frequency of the input audio signal.

7. The audio amplifier of claim 5, wherein the comparator pulse width modulates the input audio signal.

8. The audio amplifier of claim 5, wherein the output of the clock oscillator circuit periodically resets the flip-flop.

9. The audio amplifier of claim 5, wherein the driving network provides complementary switching to at least one pair of transistors.

10. The audio amplifier of claim 5, wherein the enable circuit produces a disable signal at power down, and wherein the disable signal is provided to the driver network prior to the clock oscillator circuit.

* * * * *

UNITED STATES PATENT AND TRADEMARK OFFICE
CERTIFICATE OF CORRECTION

PATENT NO. : 6,356,151 B1
DATED : March 12, 2002
INVENTOR(S) : Mehmet K. Nalbant It is certified that error appears in the above-identified patent and that said Letters Patent is hereby corrected as shown below:

Column 6,
Lines 7-8, delete "level shifted input signal" and insert -- sawtooth carrier 104A --.
Lines 8-9, delete "sawtooth carrier 104A" and insert -- level shifted signal 120A --.

Signed and Sealed this

Thirty-first Day of December, 2002

JAMES E. ROGAN
*Director of the United States Patent and Trademark Office*